US009396994B2

(12) United States Patent
Kim et al.

(10) Patent No.: US 9,396,994 B2
(45) Date of Patent: Jul. 19, 2016

(54) SEMICONDUCTOR DEVICE AND METHOD FOR MANUFACTURING THE SAME

(71) Applicants:Industry-Academic Cooperation Foundation, Yonsei University, Seoul (KR); Incheon University Industry Academic Cooperation Foundation, Incheon (KR)

(72) Inventors: Hyungjun Kim, Seoul (KR); Jaehong Yoon, Seoul (KR); Soohyeon Kim, Uijeongbu-si (KR); Han-Bo-Ram Lee, Seoul (KR)

(73) Assignee: INDUSTRY-ACADEMIC COOPERATION FOUNDATION, YONSEI UNIVERSITY, Incheon (KR)

( * ) Notice: Subject to any disclaimer, the term of this patent is extended or adjusted under 35 U.S.C. 154(b) by 0 days.

(21) Appl. No.: 14/598,080

(22) Filed: Jan. 15, 2015

(65) Prior Publication Data

US 2016/0163588 A1    Jun. 9, 2016

(30) Foreign Application Priority Data

Dec. 5, 2014    (KR) .......................... 10-2014-0173755

(51) Int. Cl.
| *H01L 21/768* | (2006.01) |
| *H01L 23/00* | (2006.01) |
| *H01L 23/532* | (2006.01) |

(52) U.S. Cl.
CPC .... *H01L 21/76871* (2013.01); *H01L 23/53266* (2013.01)

(58) Field of Classification Search
CPC ..................... H01L 21/76877; H01L 21/3141; H01L 2924/0002; H01L 21/76843; H01L 2221/1089
See application file for complete search history.

(56) References Cited

U.S. PATENT DOCUMENTS

| 6,271,122 | B1 * | 8/2001 | Wieczorek ........ H01L 21/28518 257/E21.165 |
| 7,846,841 | B2 | 12/2010 | Ishizaka et al. |
| 2009/0246952 | A1 | 10/2009 | Ishizaka et al. |

OTHER PUBLICATIONS

Notice of Grounds for Rejection for KR App No. 10-2014-0173755 dated Sep. 2, 2015, 10 pgs.
The International Technology Roadmap for Semiconductors: 2013.
C.C. Chen, et al., "Preparation of Co—Ti—N nanocomposite films", Surface and Coatings Technology 151-152 (2002) 59-62.
Takeo Oku, et al., "Diffusion barrier property of TaN between Si and Cu", Applied Surface Science 99 (1996) 265-272.
Hideharu Shimizu et al, "CVD of cobalt—tungsten alloy film as a novel copper diffusion barrier", Microelectronic Engineering 106 (2013) 91-95.

* cited by examiner

*Primary Examiner* — Jasmine Clark
(74) *Attorney, Agent, or Firm* — Procopio, Cory, Hargreaves & Savitch LLP (57) ABSTRACT

The present invention relates to a semiconductor device and a method for manufacturing the same. Disclosed is a semiconductor device including a substrate, a conductive line on the substrate, and a seed layer between the substrate and the conductive line, the seed layer including cobalt titanium nitride.

9 Claims, 9 Drawing Sheets

SEMICONDUCTOR DEVICE AND METHOD FOR MANUFACTURING THE SAME

This work was supported by the Technology Innovation Program Industrial Strategic Technology Development Program (10035430), Development of reliable fine-pitch metallization technologies, funded by the Ministry of Knowledge Economy (MKE), Korea.

CROSS-REFERENCE TO RELATED APPLICATIONS

This U.S. non-provisional patent application claims priority under 35 U.S.C. §119 of Korean Patent Application No. 10-2014-0173755, filed on Dec. 5, 2014, the entire contents of which are hereby incorporated by reference.

BACKGROUND OF THE INVENTION

The present invention disclosed herein relates to a semiconductor device and a method for manufacturing the same.

A copper wiring is generally used to form a circuit pattern in a semiconductor device. A diffusion bather for preventing copper from diffusing to a substrate is formed on the substrate before electroplating copper on the substrate, and a seeding layer for stably forming copper on the substrate is formed on the diffusion barrier. That is, typically, a double thin film of a diffusion layer such as a TiN diffusion layer and a seeding layer such as a Ru seeding layer is formed to form a copper wiring.

A typical double thin film process causes an increase in the cost of a manufacturing process. Furthermore, as a size and a circuit line width of a semiconductor device are decreased and a structure of a semiconductor becomes more complicated, it is difficult to apply a double thin film structure to recent nano-scale semiconductor devices, and the double thin film structure causes a significant difficulty in a copper electroplating process. Moreover, the double thin film structure increases a resistance of a copper wiring.

Since a Co metal thin film contains a polycrystalline material, a diffusion path of copper is formed along a grain boundary, degrading diffusion barrier characteristics of the Co metal thin film. Ru, which is a type of a precious metal, makes it difficult to reduce a cost. Furthermore, since an oxidizing agent such as oxygen is used as a reactant, oxidation of a thin film may occur at the time of associating with a related process. In the case of copper, surface oxidation rapidly occurs.

SUMMARY OF THE INVENTION

The present invention provides a semiconductor device including a multifunctional single thin film seed layer having both a function of a seeding layer and a function of a diffusion barrier to reduce the cost of a wiring process, and a method for manufacturing the same.

The present invention also provides a semiconductor device having characteristics suitable for nano-scale devices and enabling avoidance of oxidation of a thin film at a related process when an atomic layer deposition process is performed, and a method for manufacturing the same.

The present invention also provides a semiconductor device having a conformal conductive wiring and a low resistivity to decrease a resistance and reduce current consumption, and a method for manufacturing the same.

The problems to be solved by the present invention are not limited to the above-mentioned problems. Other technical problems not mentioned would be clearly understood by those skilled in the art from the disclosure below.

Embodiments of the present invention provide semiconductor devices including a substrate, a conductive line on the substrate, and a seed layer between the substrate and the conductive line, the seed layer including cobalt titanium nitride.

In some embodiments, an atomic ratio of cobalt (Co) to a total number of atoms of titanium nitride (TiN) in the seed layer may be from about 0.25 to about 4.

In other embodiments, the seed layer may include a single thin film layer having both a function of a seeding layer for electrodepositing the conductive line on the substrate and a function of a diffusion barrier for preventing a conductive material of the conductive line from diffusing to the substrate.

In other embodiments of the present invention, methods for manufacturing a semiconductor device include forming a seed layer on a substrate, the seed layer including cobalt titanium nitride, and forming a conductive line on the seed layer.

In some embodiments, the forming the seed layer on the substrate may include forming the seed layer so that an atomic ratio of cobalt (Co) to a total number of atoms of titanium nitride (TiN) in the seed layer is from about 0.25 to about 4.

In other embodiments, the forming the seed layer on the substrate may be performed by using atomic layer deposition.

In still other embodiments, the forming the seed layer on the substrate may include repeating a first cycle M number of times, the first cycle comprising sequentially exposing a cobalt-containing precursor and a first reactant to the substrate, and repeating a second cycle N number of times, the second cycle comprising sequentially exposing a titanium-nitride-containing precursor and a second reactant to the substrate, wherein a ratio of M to N may be from about 7 to about 50.

In even other embodiments, the first reactant and the second reactant may include an ammonia gas.

In yet other embodiments, the forming the seed layer on the substrate may include forming the seed layer by repeating a super cycle from about 25 to about 200 times, the super cycle including repeating the first cycle M number of times and repeating the second cycle N number of times.

In other embodiments of the present invention, methods for forming a seed layer include repeating a first atomic layer deposition cycle M number of times, the first atomic layer deposition cycle comprising sequentially exposing a cobalt-containing precursor and a first reactant to a substrate, and repeating a second atomic layer deposition cycle N number of times to form the seed layer on the substrate, the second atomic layer deposition cycle comprising sequentially exposing a titanium-nitride-containing precursor and a second reactant to the substrate, the seed layer including cobalt titanium nitride.

In some embodiments, a ratio of M to N may be from about 7 to about 50.

In other embodiments, an atomic ratio of cobalt (Co) to a total number of atoms of titanium nitride (TiN) in the seed layer may be from about 0.25 to about 4.

In still other embodiments, the first reactant and the second reactant may include an ammonia gas.

In even other embodiments, the seed layer may be formed by repeating a super cycle from about 25 to about 200 times, the super cycle including repeating the first atomic layer deposition cycle M number of times and repeating the second atomic layer deposition cycle N number of times.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

The terminology used herein is not for delimiting the present invention but for describing specific embodiments. The terms of a singular form may include plural forms unless otherwise specified. It will be further understood that the terms "comprise", "comprising,", "include", "including", "have", "having" and "provided with", when used herein, specify the presence of stated features, numbers, steps, operations, elements, components or combinations thereof, but do not preclude the presence or addition of one or more other features, numbers, steps, operations, elements, components or combinations thereof.

According to a method for manufacturing a semiconductor device according to an embodiment of the present invention, when a conductive line is disposed on a substrate, a Co—TiN single thin film having both a diffusion barrier characteristic and a seeding layer characteristic is formed between the substrate and the conductive line. According to an embodiment of the present invention, by virtue of a Co—TiN single thin film seed layer having both a diffusion barrier characteristic and a seeding layer characteristic, the cost of a copper wiring process may be reduced, and the rate of production of a semiconductor device may be improved.

A semiconductor device manufacturing process according to an embodiment of the present invention may be more suitable for nano-semiconductor devices, compared to a typical process in which different materials are used for a seeding layer and a diffusion bather. According to an embodiment of the present invention, a multifunctional single thin film having both a diffusion barrier characteristic and a seeding layer characteristic may be formed by adjusting an atom ratio between cobalt and titanium nitride composing a seed layer of a single thin film. Furthermore, oxidation of a thin film at a related process may be avoided by using an ammonia gas that is a reducing agent as a reactant gas during an atomic layer deposition process.

Figure 1:
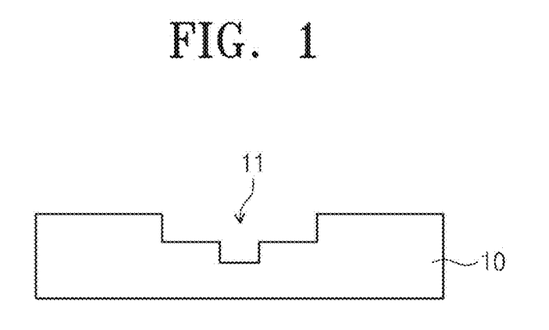
FIGS. 1 to 3 are diagrams illustrating a method for manufacturing a semiconductor device according to an embodiment of the present invention.
Figure 2:
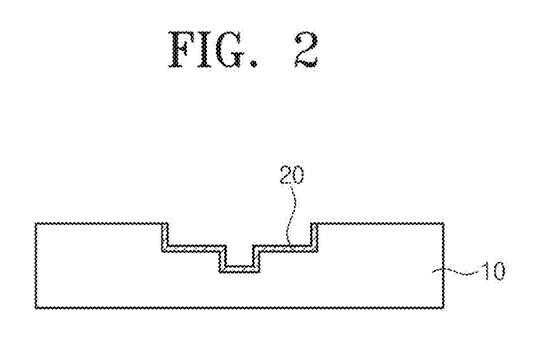
Figure 3:
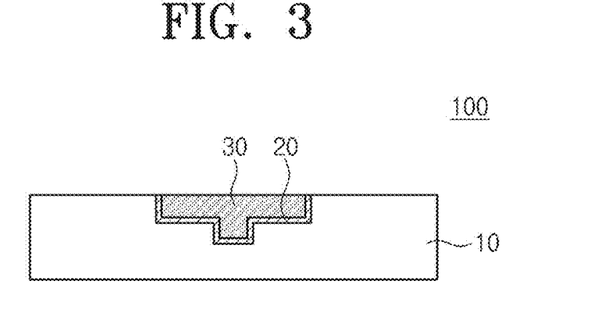

FIGS. 1 to 3 are diagrams illustrating a method for manufacturing a semiconductor device according to an embodiment of the present invention. Referring to FIG. 1, a groove part 11 for forming a conductive circuit pattern (conductive line) is formed in a substrate 10. The groove part 11 may be formed through, for example, lithography. The substrate 10 may be a substrate based on a semiconductor such as silicon, a glass substrate or a plastic substrate.

Referring to FIG. 2, a seed layer 20 is formed on the substrate 10. The seed layer 20 may be formed in the groove part 11 of the substrate 10 through atomic layer deposition. The seed layer 20 includes cobalt titanium nitride. The seed layer 20 may be provided as a Co—TiN single thin film. The seed layer 20 may include a single thin film layer having both a function of a seeding layer for electrodepositing, on the substrate, a conductive material of a circuit pattern to be formed in the groove part 11 of the substrate 10 and a function of a diffusion barrier for preventing the conductive material from diffusing to the substrate 10.

Referring to FIG. 3, a conductive line 30 is formed on the seed layer 20 in the groove part 11 of the substrate 10. The conductive line 30 may be formed of, for example, a conductive material such as copper (Cu). The conductive line 30 may be formed on the substrate 10 through, for example, electroplating or electroless plating.

A semiconductor device 100 according to an embodiment of the present invention includes the substrate 10, the conductive line 30 on the substrate 10, and the seed layer 20 between the substrate 10 and the conductive line 30. An atomic ratio of cobalt (Co) to a total number of atoms of titanium nitride (TiN) (Co/TiN) in the seed layer 20 may be from about 0.25 to about 4.

If the atomic ratio of Co/TiN of the seed layer 20 is less than about 0.25, the seed layer 20 may be degraded in terms of the function of a seeding layer for electrodepositing the conductive line 30 on the substrate 10. If the atomic ratio of Co/TiN of the seed layer 20 is larger than about 4, the seed layer 20 may be degraded in terms of the function of a diffusion barrier for preventing the conductive line 30 from diffusing to the substrate 10.

Figure 4:
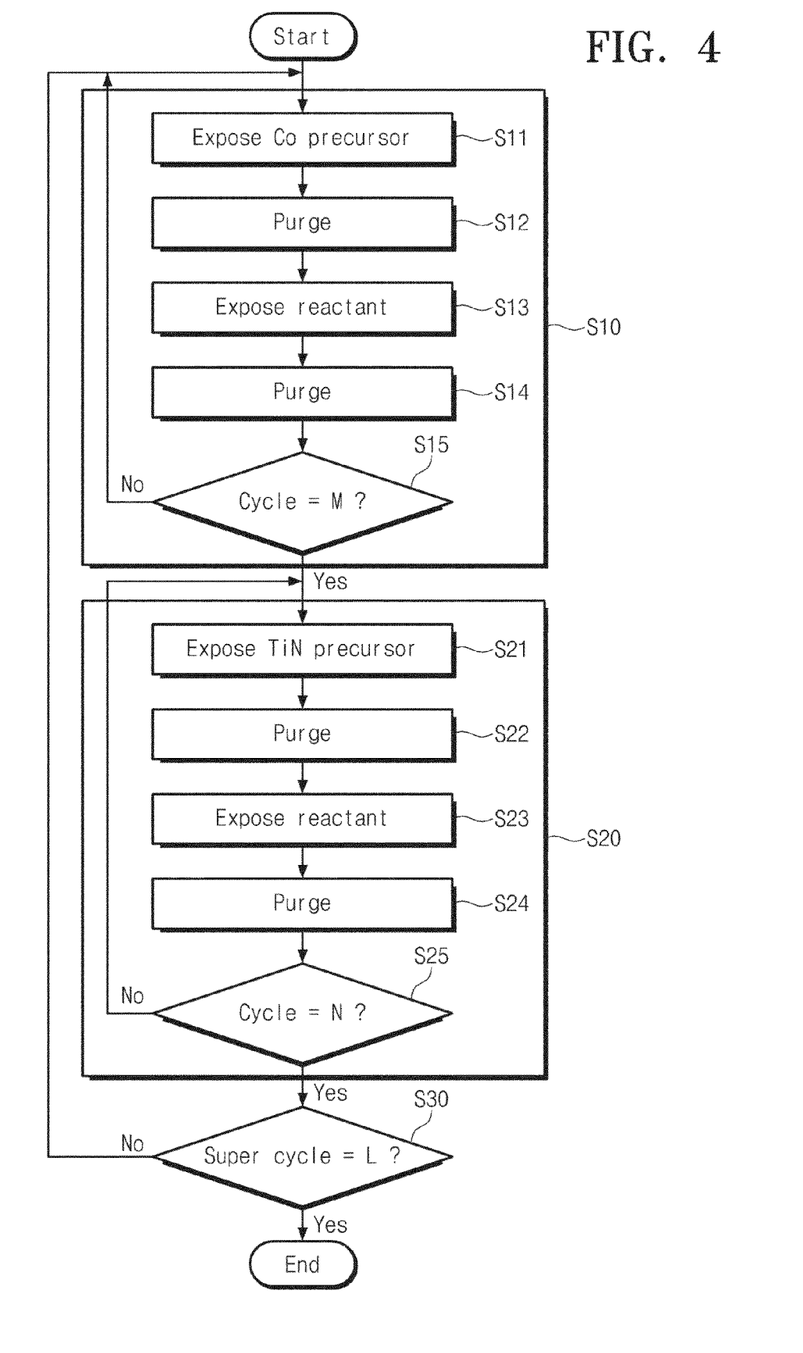
FIG. 4 is a flowchart illustrating a seed layer forming method according to an embodiment of the present invention.

FIG. 4 is a flowchart illustrating a seed layer forming method according to an embodiment of the present invention. Referring to FIGS. 2 to 4, the seed layer forming method according to an embodiment of the present invention may include repeating, M number of times, a first atomic layer deposition cycle for sequentially exposing a cobalt-containing precursor and a first reactant to the substrate 10 (S10) and repeating, N number of times, a second atomic layer deposition cycle for sequentially exposing a titanium nitride-containing precursor and a second reactant to the substrate 10 (S20).

In operation S10, the cobalt-containing precursor may be exposed to the substrate 10 in an atomic layer deposition vacuum chamber (S11) and then may be purged by an inert gas such as argon (Ar) (S12), and, thereafter, a reactant such as an ammonia ($NH_3$) gas may be exposed to the substrate 10 (S13) and then may be purged by an inert gas (S14) to thereby perform the first atomic layer deposition cycle. The first atomic layer deposition cycle including operations S11 to S14 may be repeated M number of times (S15).

Once the cobalt precursor is adsorbed onto the substrate 10, the second atomic layer deposition cycle (operations S21 to S24) is performed in operation S20. That is, the titanium nitride-containing precursor may be exposed to the substrate 10 onto which the cobalt precursor is adsorbed (S21) and then may be purged by an inert gas such as argon (Ar) (S22), and, thereafter, a reactant such as an ammonia ($NH_3$) gas may be exposed to the substrate 10 (S23) and then may be purged by an inert gas (S24) to thereby perform the second atomic layer deposition cycle. The second atomic layer deposition cycle may be repeated N number of times (S25).

In an embodiment, a ratio of M that is the number of times of repeating the first atomic layer deposition cycle to N that is the number of times of repeating the second atomic layer deposition cycle (M/N) may be from about 7 to about 50 to form the seed layer 30. If the ratio of M/N is less than about 7, the atomic ratio of Co/TiN of the seed layer 20 is less than about 0.25, and thus the seed layer 20 may be degraded in terms of the function of a seeding layer for electrodepositing the conductive line 30 on the substrate 10. On the contrary, if the ratio of M/N is larger than about 50, the atomic ratio of Co/TiN of the seed layer 20 is larger than about 4, and thus the seed layer 20 may be degraded in terms of the function of a diffusion barrier for preventing the copper of the conductive line 30 from diffusing to the substrate 10.

Therefore, it may be necessary to form the seed layer 20 with the ratio of M/N being from about 7 to about 50 so that the atomic ratio of Co/TiN of the seed layer 20 is from about 0.25 to about 4.

A super cycle including the M number of times of the first atomic layer deposition cycle and the N number of times of the second atomic layer deposition cycle may be repeated L number of times to form the seed layer 20 on the substrate 10 (S30). According to an embodiment of the present invention, the super cycle may be repeated about 25 to 200 times to form the seed layer 20.

If the number L of times of repeating the super cycle is less than about 25, a continuous thin film may not be formed on the substrate 10, causing an increase in current consumption and degradation of characteristics of the seed layer 20. If the number of times of repeating the super cycle is larger than about 200, the seed layer 20 is formed to a thickness larger than about 100 nm and thus may not be suitable for a circuit pattern of a semiconductor device.

According to an embodiment of the present invention, by virtue of the seed layer of the Co—TiN single thin film having both a diffusion barrier characteristic and a seeding layer characteristic, the cost of a copper wiring process may be reduced, and the rate of production of a semiconductor device may be improved. A semiconductor device manufacturing process according to an embodiment of the present invention provides more suitable characteristics for nano-semiconductor devices, compared to a typical process in which different materials are used for a seeding layer and a diffusion barrier.

According to an embodiment of the present invention, a multifunctional single thin film having both a diffusion barrier characteristic and a seeding layer characteristic may be formed by adjusting the atomic ratio between cobalt and titanium nitride from about 1:4 to about 4:1 in the seed layer of the single thin film. Furthermore, oxidation of a thin film at a related process may be avoided by using an ammonia gas that is a reducing agent as a reactant at an atomic layer deposition process.

Example 1

An experiment was conducted to evaluate the seeding layer characteristic and the diffusion layer characteristic of the semiconductor device according to an embodiment of the present invention. A Si substrate was disposed in a vacuum chamber of atomic layer deposition equipment, and a Co—TiN alloy thin film seed layer and a Co seed layer were formed on the Si substrate in order to be used as an invention example and a comparative example respectively. When the seed layers were deposited, a temperature of the substrate was about 200° C., and a temperature of a Co precursor was about 75° C.

(a) Bis(N-tert-butyl-N'-ethylpropionamidinato)cobalt(II) as the Co precursor was exposed to the Si substrate for about eight seconds, and then (b) was purged by argon (Ar) gas for about five seconds, and, thereafter, (c) ammonia ($NH_3$) reactant was exposed to the Si substrate for about eight seconds, and then (d) was purged by argon gas for about five seconds. One cycle including processes (a) to (d) was repeated 30 times.

Thereafter, (e) tetrakis-(di-methylamino)-titanium as a TiN precursor was exposed to the Si substrate for about five seconds, and then (f) was purged by argon gas for about five seconds, and, thereafter, (g) ammonia ($NH_3$) reactant was exposed to the Si substrate for about eight seconds, and then (h) was purged by argon gas for about five seconds. One cycle including processes (e) to (h) was performed. Accordingly, a Co—TiN thin film was formed on the Si substrate through substitution reaction.

A super cycle was repeated 23 times, the super cycle including performing a first atomic deposition cycle of processes (a) to (d) 30 times and performing a second atomic layer deposition cycle of processes (e) to (h) one time. Accordingly, a seed layer of a Co—TiN single thin film having a thickness of about 20 nm was atomic-layer-deposited on the Si substrate. As a result of analyzing elements of the Co—TiN seed layer, the atomic ratio of Co:TiN was measured as about 2:1.

Figure 5A:
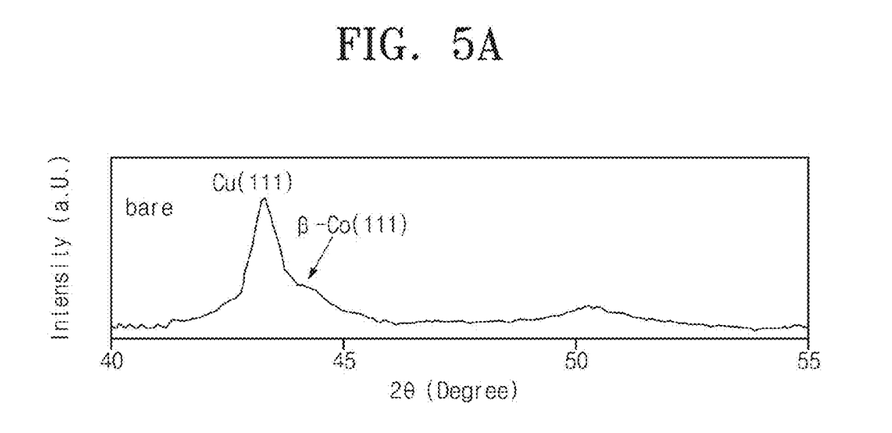
FIGS. 5A to 5C are graphs illustrating a thermal stability characteristic of a seed layer (Co:TiN=2:1) formed on a substrate according to an embodiment of the present invention in the case where the seed layer is bare, has undergone a 600° C. heat treatment and has undergone a 700° C. heat treatment respectively.
Figure 5B:
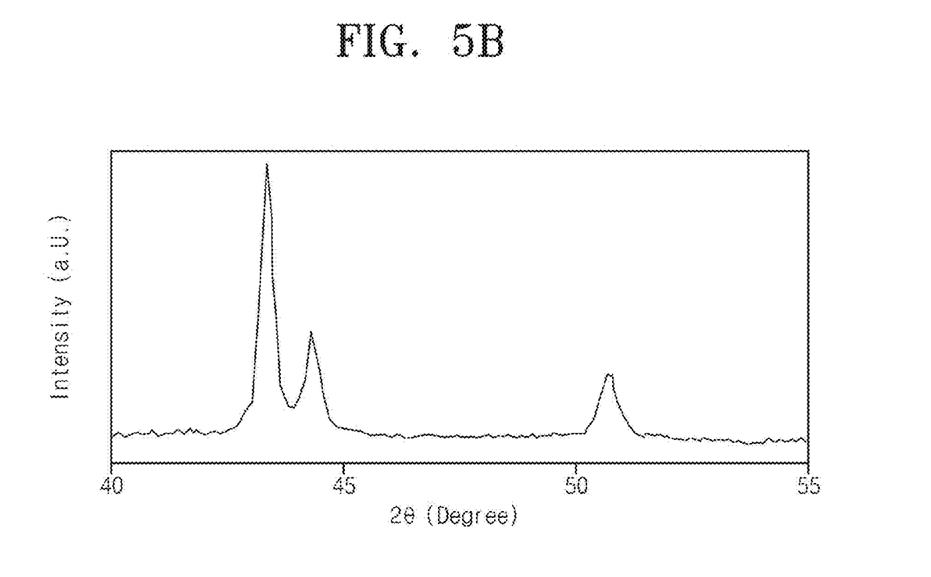
Figure 5C:
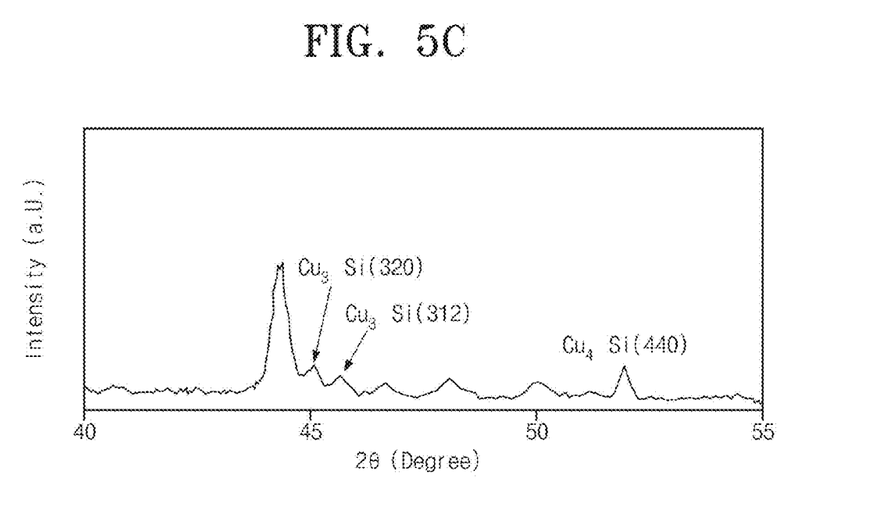

FIGS. 5A to 5C are graphs illustrating a thermal stability characteristic of the seed layer (Co:TiN=2:1) formed on the substrate according to an embodiment of the present invention. In order to evaluate the diffusion barrier characteristic of the Co—TiN thin film, a Cu thin film was deposited on the Co—TiN thin film on the Si substrate through ex-situ physical vapor deposition. Thereafter, a heat treatment was performed on a test piece, while allowing $Ar/H_2$ gas to flow thereto for about five minutes at temperatures of about 600° C. and about 700° C. FIGS. 5A to 5C show the thermal stability characteristic of the Co—TiN seed layer in the case where the Co—TiN seed layer is bare, has undergone a 600° C. heat treatment and has undergone a 700° C. heat treatment respectively.

Referring to FIGS. 5A to 5C, a $Cu_xSi_y$ phase was not observed from the substrate in the case of performing the 600° C. heat treatment, but the $Cu_xSi_y$ phase ($Cu_3Si$, $Cu_4Si$) was observed in the case of performing the 700° C. heat treatment. This result indicates that copper passes through the Co—TiN thin film and diffuses to the Si substrate in the case of performing the 700° C. heat treatment. From FIGS. 5A to 5C, it was confirmed that the Co—TiN thin film seed layer manufactured according to an embodiment of the present invention has the diffusion bather characteristic at a temperature of less than about 700° C.

In the case of a Co thin film test piece that is a comparative example, the $Cu_xSi_y$ phase was observed from the substrate in the case of performing the 600° C. heat treatment. Therefore, it may be understood that the thermal stability of the Co—TiN thin film seed layer is improved by as much as about 100° C., compared to that of the Co single thin film that has the diffusion barrier characteristic at a temperature of 600° C. or below, under the same heat treatment conditions. Furthermore, according to an embodiment of the present invention, compared to a typical $Al_2O_3$ or $HfO_2$ dielectric layer developed as a diffusion barrier, which has the diffusion barrier characteristic at a temperature of about 700° C. or below, the Co—TiN thin film seed layer has a lower resistivity value while having the same thermal stability, so that a total resistance of a device may be reduced.

Example 2

A Co—TiN seed layer was deposited on a Si substrate under the same conditions as those of example 1, excepting that a super cycle was repeated 45 times, the super cycle including performing processes (a) to (7) seven times and performing processes (e) to (h) one time. Accordingly, a seed layer of a Co—TiN single thin film having a thickness of about 20 nm was atomic-layer-deposited on the Si substrate. As a result of analyzing elements of the Co—TiN seed layer, the atomic ratio of Co:TiN was measured as about 1:2.

Figure 6A:
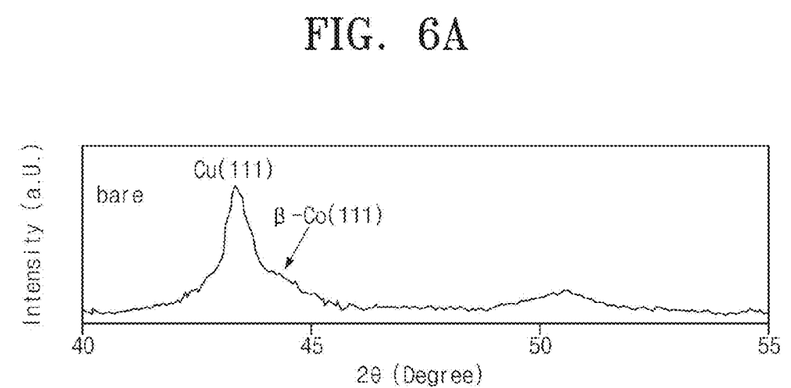
FIGS. 6A to 6C are graphs illustrating a thermal stability characteristic of a seed layer (Co:TiN=1:2) formed on a substrate according to an embodiment of the present invention in the case where the seed layer is bare, has undergone a 600° C. heat treatment and has undergone a 700° C. heat treatment respectively.
Figure 6B:
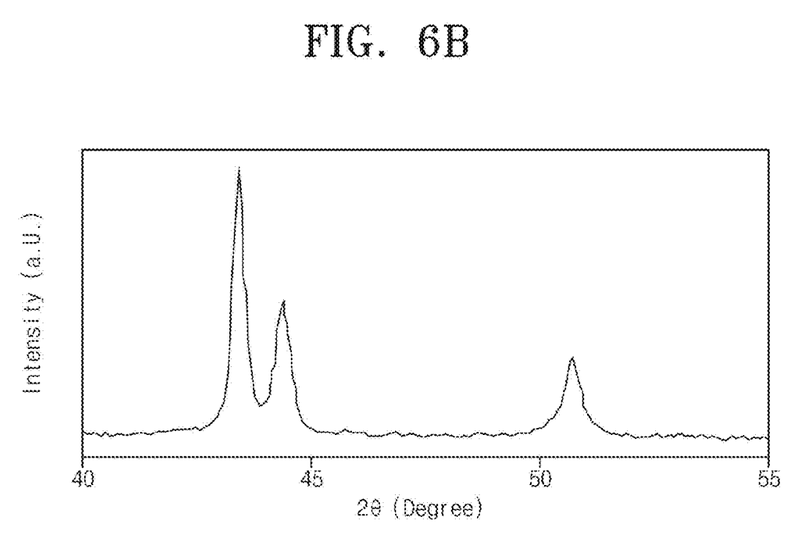
Figure 6C:
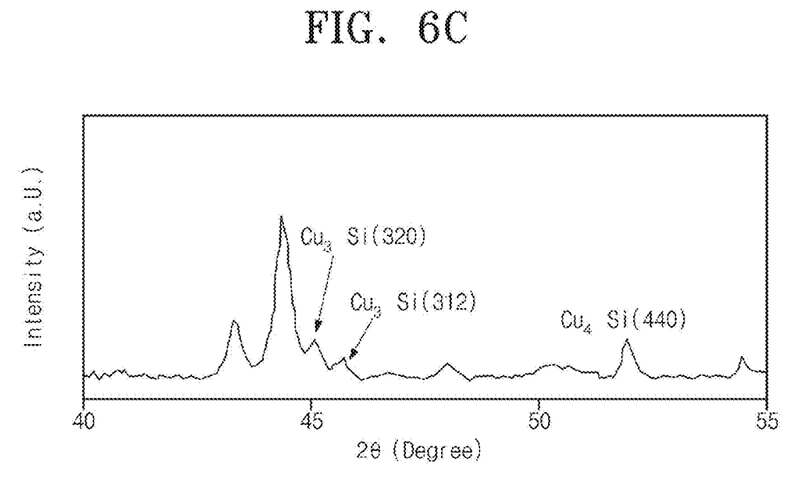

FIGS. 6A to 6C are graphs illustrating a thermal stability characteristic of the seed layer (Co:TiN=1:2) formed on the substrate according to another embodiment of the present invention. In order to evaluate the diffusion barrier characteristic of the Co—TiN thin film, a Cu thin film was deposited on the Co—TiN thin film on the Si substrate through ex-situ physical vapor deposition, and then, a heat treatment was performed on a test piece, while allowing $Ar/H_2$ gas to flow thereto for about five minutes at temperatures of about 600° C. and about 700° C. FIGS. 6A to 6C show the thermal stability characteristic of the Co—TiN seed layer that is bare, has undergone a 600° C. heat treatment and has undergone a 700° C. heat treatment respectively.

Referring to FIGS. 6A to 6C, a $Cu_xSi_y$ phase was not observed in the case of performing the 600° C. heat treatment on the seed layer having the C:TiN ratio of 1:2, and the $Cu_xSi_y$ phase ($Cu_3Si$, $Cu_4Si$) was observed in the case of performing the 700° C. heat treatment. This result indicates that copper passes through the Co—TiN thin film and diffuses to the Si substrate in the case of performing the 700° C. heat treatment. That is, it was confirmed that the Co—TiN thin film seed layer manufactured according to an embodiment of the present invention has the diffusion barrier characteristic at a temperature of less than about 700° C.

In the case of a Co thin film test piece that is a comparative example, the $Cu_xSi_y$ phase was observed in the case of performing the 600° C. heat treatment. Therefore, it may be understood that the thermal stability of the Co—TiN thin film seed layer is improved by as much as about 100° C., compared to that of the Co single thin film that has the diffusion barrier characteristic at a temperature of 600° C. or below, under the same heat treatment conditions.

Figure 7A:
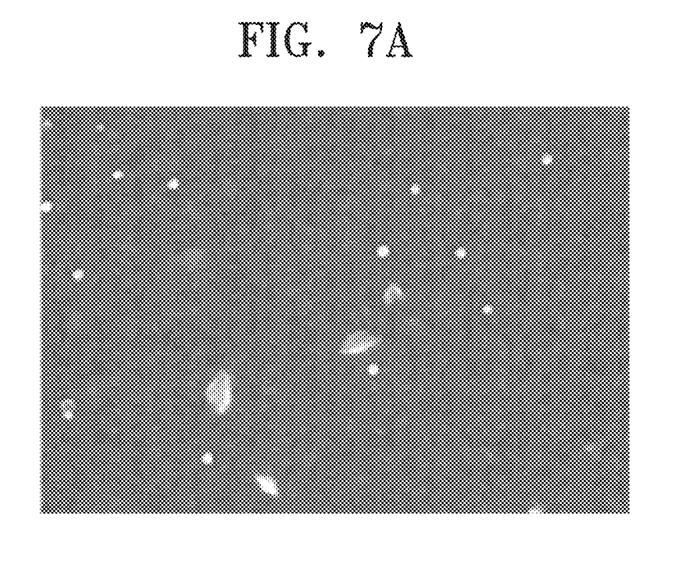
FIG. 7A is a scanning electron microscope (SEM) image showing a planar view of a Co thin film test piece (comparative example) electroplated with copper.
Figure 7B:
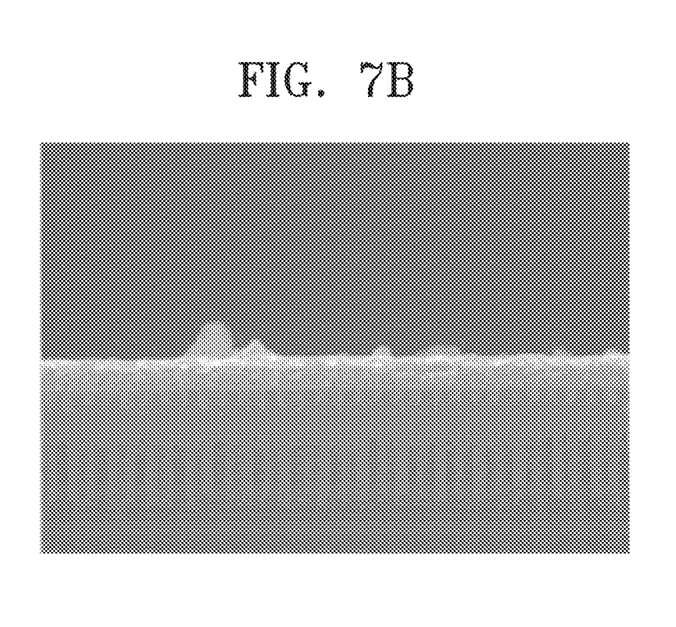
FIG. 7B is a SEM image showing a cross section of the Co thin film test piece (comparative example) electroplated with copper.
Figure 8A:
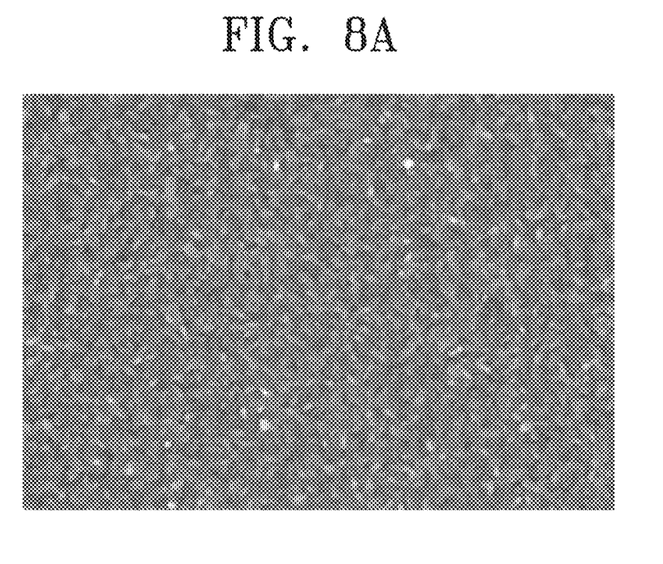
FIG. 8A is a SEM image showing a planar view of a Co—TiN thin film test piece manufactured according to example 1 of the present invention and electroplated with copper.
Figure 8B:
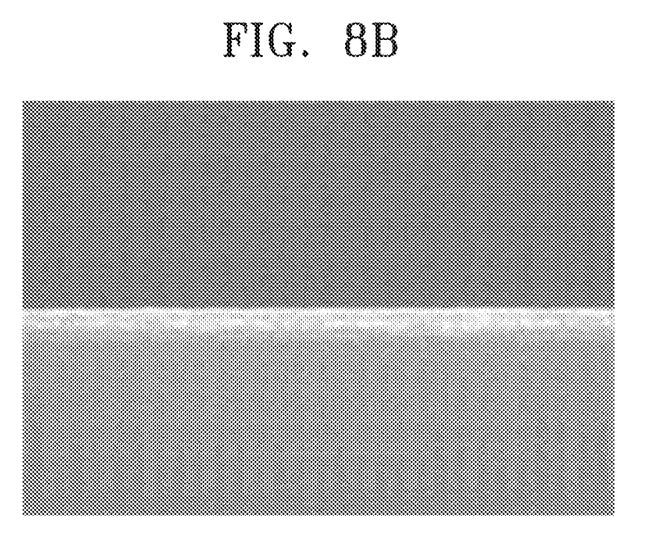
FIG. 8B is a SEM image showing a cross section of the Co—TiN thin film test piece manufactured according to example 2 of the present invention and electroplated with copper.

FIG. 7A is a scanning electron microscope (SEM) image showing a planar view of the Co thin film test piece (comparative example) electroplated with copper, FIG. 7B is a SEM image showing a cross section of the Co thin film test piece (comparative example) electroplated with copper, FIG. 8A is a SEM image showing a planar view of the Co—TiN thin film test piece manufactured according to example 1 of the present invention and electroplated with copper, and FIG. 8B is a SEM image showing a cross section of the Co—TiN thin film test piece manufactured according to example 2 of the present invention and electroplated with copper.

When electroplating the Co—TiN thin film test pieces, an electrodeposition current was set to be about 80 $mA/cm^2$ for about 0.5 second and then was changed to about 20 $mA/cm^2$ for about 10.5 seconds. It may be understood that copper is non-conformally deposited on the Co thin film electroplated with copper as illustrated in FIGS. 7A and 7B. On the contrary, in the case of electroplating the Co—TiN thin films with copper according to an embodiment of the present invention, copper thin films are conformally formed as illustrated in FIGS. 8A and 8B.

After electroplating a thin film test piece of a seed layer on a substrate, a total resistivity of a thin film was measured. The resistivity of the comparative example, i.e., the Co thin film, was measured as about 6.09 $u\Omega\cdot cm$, and the resistivity of the Co—TiN thin film manufactured according to an embodiment of the present invention was measured as about 4.39 $u\Omega\cdot cm$.

Therefore, in the case of forming the Co—TiN single thin film as a seed layer through atomic layer deposition according to an embodiment of the present invention, a copper thin film may be more conformally formed than that of the Co thin film, providing an improved seed layer characteristic and an overall low resistivity. Therefore, when the Co—TiN single thin film is applied as a seed layer, a total resistance of a device may be reduced.

Furthermore, according to an embodiment of the present invention, by virtue of the seed layer of the Co—TiN single thin film having both the diffusion barrier characteristic and the seeding layer characteristic, the cost of a copper wiring process may be reduced, and the rate of production of a semiconductor device may be improved. Moreover, the seed layer of the Co—TiN single thin film may be suitably applied to nano-semiconductor devices having a copper line width of not greater than 30 nm.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for manufacturing a semiconductor device, the method comprising:
    forming a seed layer on a substrate, the seed layer comprising cobalt titanium nitride; and
    forming a conductive line on the seed layer,
    wherein the forming the seed layer on the substrate is performed by using atomic layer deposition, and the forming the seed layer on the substrate comprises:
    repeating a first cycle M number of times, the first cycle comprising sequentially exposing a cobalt-containing precursor and a first reactant to the substrate; and
    repeating a second cycle N number of times, the second cycle comprising sequentially exposing a titanium-nitride-containing precursor and a second reactant to the substrate,
    wherein a ratio of M to N is from about 7 to about 50.

2. The method of claim 1, wherein the forming the seed layer on the substrate comprises forming the seed layer so that an atomic ratio of cobalt (Co) to a total number of atoms of titanium nitride (TiN) in the seed layer is from about 0.25 to about 4.

3. The method of claim 1, wherein the first reactant and the second reactant comprise an ammonia gas.

4. The method of claim 1, wherein the forming the seed layer on the substrate comprises forming the seed layer by repeating a super cycle from about 25 to about 200 times, the super cycle comprising repeating the first cycle M number of times and repeating the second cycle N number of times.

5. A method for forming a seed layer, the method comprising:
   repeating a first atomic layer deposition cycle M number of times, the first atomic layer deposition cycle comprising sequentially exposing a cobalt-containing precursor and a first reactant to a substrate; and
   repeating a second atomic layer deposition cycle N number of times to form the seed layer on the substrate, the second atomic layer deposition cycle comprising sequentially exposing a titanium-nitride-containing precursor and a second reactant to the substrate, the seed layer comprising cobalt titanium nitride.

6. The method of claim 5, wherein a ratio of M to N is from about 7 to about 50.

7. The method of claim 5, wherein an atomic ratio of cobalt (Co) to a total number of atoms of titanium nitride (TiN) in the seed layer is from about 0.25 to about 4.

8. The method of claim 5, wherein the first reactant and the second reactant comprise an ammonia gas.

9. The method of claim 5, wherein the seed layer is formed by repeating a super cycle from about 25 to about 200 times, the super cycle comprising repeating the first atomic layer deposition cycle M number of times and repeating the second atomic layer deposition cycle N number of times.

* * * * *